(12) United States Patent
Matsubara et al.

(10) Patent No.: US 10,651,006 B2
(45) Date of Patent: May 12, 2020

(54) ION BEAM APPARATUS

(71) Applicant: Hitachi High-Tech Science Corporation, Minato-ku, Tokyo (JP)

(72) Inventors: Shinichi Matsubara, Tokyo (JP); Yoshimi Kawanami, Tokyo (JP); Hiroyasu Shichi, Tokyo (JP)

(73) Assignee: Hitachi High-Tech Science Corporation, Tokyo (JP)

( * ) Notice: Subject to any disclaimer, the term of this patent is extended or adjusted under 35 U.S.C. 154(b) by 0 days.

(21) Appl. No.: 15/935,409

(22) Filed: Mar. 26, 2018

(65) Prior Publication Data

US 2018/0308658 A1 Oct. 25, 2018

(30) Foreign Application Priority Data

Apr. 19, 2017 (JP) ................................. 2017-082547

(51) Int. Cl.
| | |
|---|---|
| *H01J 37/08* | (2006.01) |
| *H01J 37/28* | (2006.01) |
| *H01J 37/153* | (2006.01) |
| *H01J 37/10* | (2006.01) |
| *H01J 37/22* | (2006.01) |
| *H01J 37/147* | (2006.01) |

(52) U.S. Cl.
CPC .............. *H01J 37/08* (2013.01); *H01J 37/10* (2013.01); *H01J 37/147* (2013.01); *H01J 37/153* (2013.01); *H01J 37/222* (2013.01); *H01J 37/28* (2013.01); *H01J 2237/057* (2013.01); *H01J 2237/0807* (2013.01); *H01J 2237/0822* (2013.01); *H01J 2237/0827* (2013.01); *H01J 2237/1532* (2013.01)

(58) Field of Classification Search
None
See application file for complete search history.

(56) References Cited

U.S. PATENT DOCUMENTS

| | | | |
|---|---|---|---|
| 2002/0056808 A1* | 5/2002 | Tsuneta | H01J 37/21 250/306 |
| 2009/0072164 A1 | 3/2009 | Ogata et al. | |
| 2009/0200484 A1 | 8/2009 | Frosien | |

(Continued)

FOREIGN PATENT DOCUMENTS

| | | |
|---|---|---|
| CN | 101842910 A | 9/2010 |
| CN | 108496238 A | 9/2018 |

(Continued)

OTHER PUBLICATIONS

Korean-language Office Action issued in counterpart Korean Application No. 10-2018-0032439 dated Dec. 20, 2018 (six (6) pages).

(Continued)

*Primary Examiner* — Andrew Smyth
(74) *Attorney, Agent, or Firm* — Crowell & Moring LLP

(57) ABSTRACT

According to an embodiment of the present invention, an ion beam apparatus switches between an operation mode of performing irradiation with an ion beam most including $H_3^+$ ions and an operation mode of performing irradiation with an ion beam most including ions heavier than the $H_3^+$.

12 Claims, 12 Drawing Sheets

(56) References Cited

U.S. PATENT DOCUMENTS

| | | | | |
|---|---|---|---|---|
| 2010/0108902 A1* | 5/2010 | Frosien | ............... | H01J 37/08 250/396 R |
| 2010/0232559 A1 | 9/2010 | Takeishi et al. | | |
| 2011/0272593 A1 | 11/2011 | Graf et al. | | |
| 2012/0145896 A1* | 6/2012 | Ward | ............... | H01J 37/08 250/307 |
| 2013/0140473 A1* | 6/2013 | Colvin | ............... | H01J 27/022 250/492.3 |
| 2014/0175301 A1* | 6/2014 | Gierak | ............... | H01J 37/08 250/397 |
| 2014/0256121 A1 | 9/2014 | Radovanov et al. | | |
| 2017/0352517 A1 | 12/2017 | Shichi et al. | | |
| 2019/0051491 A1 | 2/2019 | Matsubara et al. | | |

FOREIGN PATENT DOCUMENTS

| | | |
|---|---|---|
| EP | 1 202 320 A2 | 5/2002 |
| EP | 2 416 342 A2 | 2/2012 |
| JP | 2007-328965 A | 12/2007 |
| JP | 2009-187950 A | 8/2009 |
| JP | 2010-114082 A | 5/2010 |
| JP | 2010114082 A * | 5/2010 |
| JP | 2010114082 A * | 5/2010 |
| JP | 2016-76431 A | 5/2016 |
| KR | 10-2009-0032963 A | 4/2009 |
| TW | I423295 | 1/2014 |
| WO | WO 2009/057669 A1 | 5/2009 |
| WO | WO 2010/132265 A2 | 11/2010 |

OTHER PUBLICATIONS

Korean-language Office Action issued in counterpart Korean Application No. 10-2018-0032439 dated Jun. 24, 2019 (six pages).
Chinese-language Office Action issued in counterpart Chinese Application No. 201810237376.2 dated Oct. 8, 2019 (six (6) pages).
Chinese-language Office Action issued in counterpart Taiwanese Application No. 107110401 dated Dec. 10, 2018 (seven (7) pages).

* cited by examiner

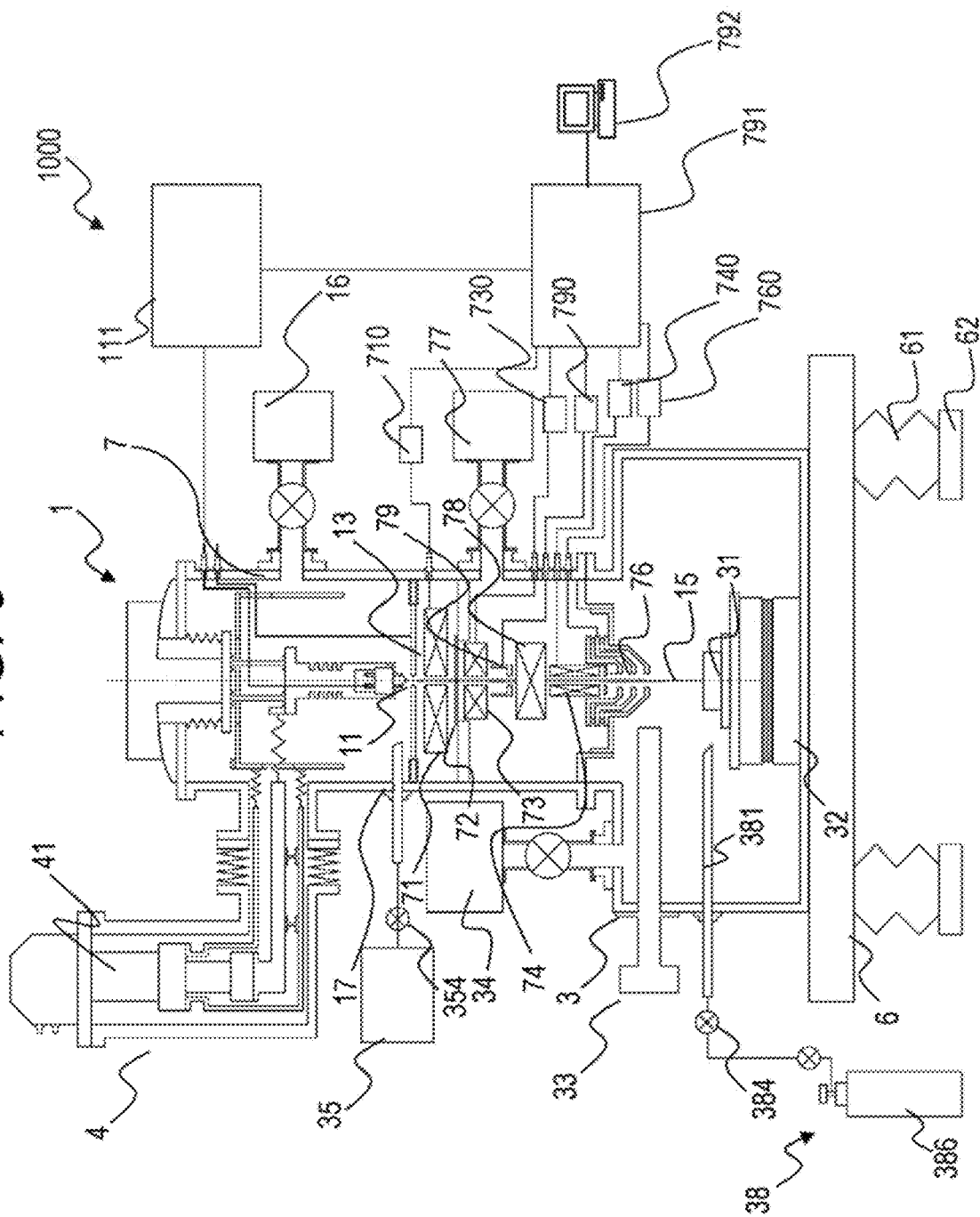

ION BEAM APPARATUS

CROSS REFERENCE TO RELATED APPLICATIONS

The present application claims priority from Japanese patent application JP 2017-082547 filed on Apr. 19, 2017, the content of which is hereby incorporated by reference into this application.

BACKGROUND OF THE INVENTION

1. Field of the Invention

The present invention relates to an ion beam apparatus.

2. Description of the Related Art

A surface structure of a sample can be observed by focusing an electron beam through an electromagnetic lens, irradiating the sample with the electron beam while scanning the electron beam, and detecting secondary electron charged particles emitted from the sample. This is called a scanning electron microscope. On the other hand, the surface structure of the sample can be observed by focusing an ion beam through the electromagnetic lens, irradiating the sample with the electron beam while scanning the electron beam, and detecting secondary charged particles emitted from the sample. This is called a scanning ion microscope (hereinafter, abbreviated as SIM).

One of the ion sources used in the SIM is a gas field ionization source (hereinafter abbreviated as GFIS). The GFIS is configured to apply a high voltage to a metallic emitter tip having a point whose curvature radius is preferably about 100 nm or less, concentrate an electric field on the point, introduce gas (ionized gas) into the vicinity of the point, field-ionize molecules of the gas, and extract the field-ionized gas molecules as an ion beam.

In the SIM using the GFIS (hereinafter, abbreviated as GFIS-SIM), an apparatus using a helium ion beam or a neon beam is mainly used. This is because when being compared with an ion source of liquid metal or an ion source using a plasma phenomenon, the ion beam emitted from the GFIS has a narrower energy width and the size of the light source is smaller, and as a result the ion beam can be finely focused.

JP 2010-114082 A discloses, as a technology aiming at "providing an ion beam apparatus of a single column enabling observation and processing of a sample", a technology regarding "a focused ion beam apparatus for processing and observing a sample by focusing an ion beam extracted from a gas field ion source and irradiating a sample 24 with the ion beam, wherein the ion source includes: an emitter chip 13 generating ions, a heater 15 heating the ions, gas inlets 110 and 112 into which first gas and at least one second gas are introduced, and a controller 172 switching between a first emitter chip temperature and a second emitter chip temperature to generate an ion beam of any of the first and second gases. The first gas is a light gas and is used for an observation mode, the at least one second gas is a heavy gas (inert gas, reaction gas) and is used for a sputtering mode (in the case of an inert gas) or a reaction mode (in the case of reaction gas)" (see abstract).

SUMMARY OF THE INVENTION

In the current GFIS-SIM, ion beam types are switched so that when a user wants to observe a sample, for example, lighter helium ions are used, and when a user wants to process a sample, for example, relatively heavier neon ions are used. Generally, however, since it is necessary to exhaust gas once from the GFIS ion source and again introduce desired ion species of ionized gas at the time of switching the ion beams, it takes time to switch the ion beams.

In order to shorten the switching time, a method for simultaneously introducing a gas for generating ion species to be used at the time of the observation and a gas for generating ion species to be used at the time of the processing into the GFIS ion source and instantly switching the ion beam types by changing an extraction voltage has been proposed. Also in JP 2010-114082 A, a similar method is used. However, if a plurality of gases are actually introduced into the GFIS ion source, generally, it has been found that the problem that an ion current is unstable occurs. The instability of the ion current causes, in particular, deterioration in a quality of an observation image of the sample.

Ionization energy of helium is highest in all atoms. Therefore, when ions are ionized at the point of the emitter tip, it is necessary to generate a high electric field at the point. In order to make the GFIS have sufficient luminance for practical use, it is necessary to emit ion beams while the point of the emitter tip is terminated with several atoms. However, if the extraction voltage for emitting the ion beams is too high, the atoms at the point of the emitter tip disappear due to the phenomenon called the electric field evaporation, and therefore the ions cannot be emitted. In order to reproduce the original luminance of the GFIS, it is necessary to reproduce an atomic terminal shape and then reproduce optimum optical conditions for the ion beam apparatus. In addition, it takes time to reproduce the original luminance.

While the helium ions belong to light ion species among the ion species that can be extracted by the GFIS, the damage to the sample still occurs at the time of observing the sample. According to the conventionally required specifications, the degree of the damage caused by the helium ions is insignificant. In recent years, however, the influence of the helium ions on the damage has become obvious.

In order to solve the above problems of the conventional ion beam apparatus, it is conceivable to use the GFIS which emits hydrogen ions at the time of observing the sample. This is because that the hydrogen ions cannot only reduce the damage because of being light, but also have ionization energy smaller than that of the helium ions. However, there is also a problem with the conventional hydrogen GFIS. That is, in principle, the conventional hydrogen GFIS is larger than the helium in terms of the energy width of the ion beam. Therefore, there is a problem in that the observation resolution or the processable width of the hydrogen GFIS becomes larger than the helium GFIS.

The present invention has been made in view of the above problem, and an object of the present invention is to provide an ion beam apparatus capable of reducing damage to a sample and shortening a switching time between observation and processing.

An ion beam apparatus according to the present invention switches between an operation mode of irradiating with an ion beam most including $H_3^+$ ions and an operation mode of irradiating with an ion beam most including ions heavier than the $H_3^+$.

The ion beam apparatus according to the present invention can switch between the operation mode of observing the sample and the operation mode of processing the sample while suppressing the damage to the sample at the time of observing the sample.

BRIEF DESCRIPTION OF THE DRAWINGS

FIG. 6 is a side cross-sectional view showing a configuration of an ion beam apparatus according to a second embodiment;

DESCRIPTION OF THE PREFERRED EMBODIMENTS

Figure 1:
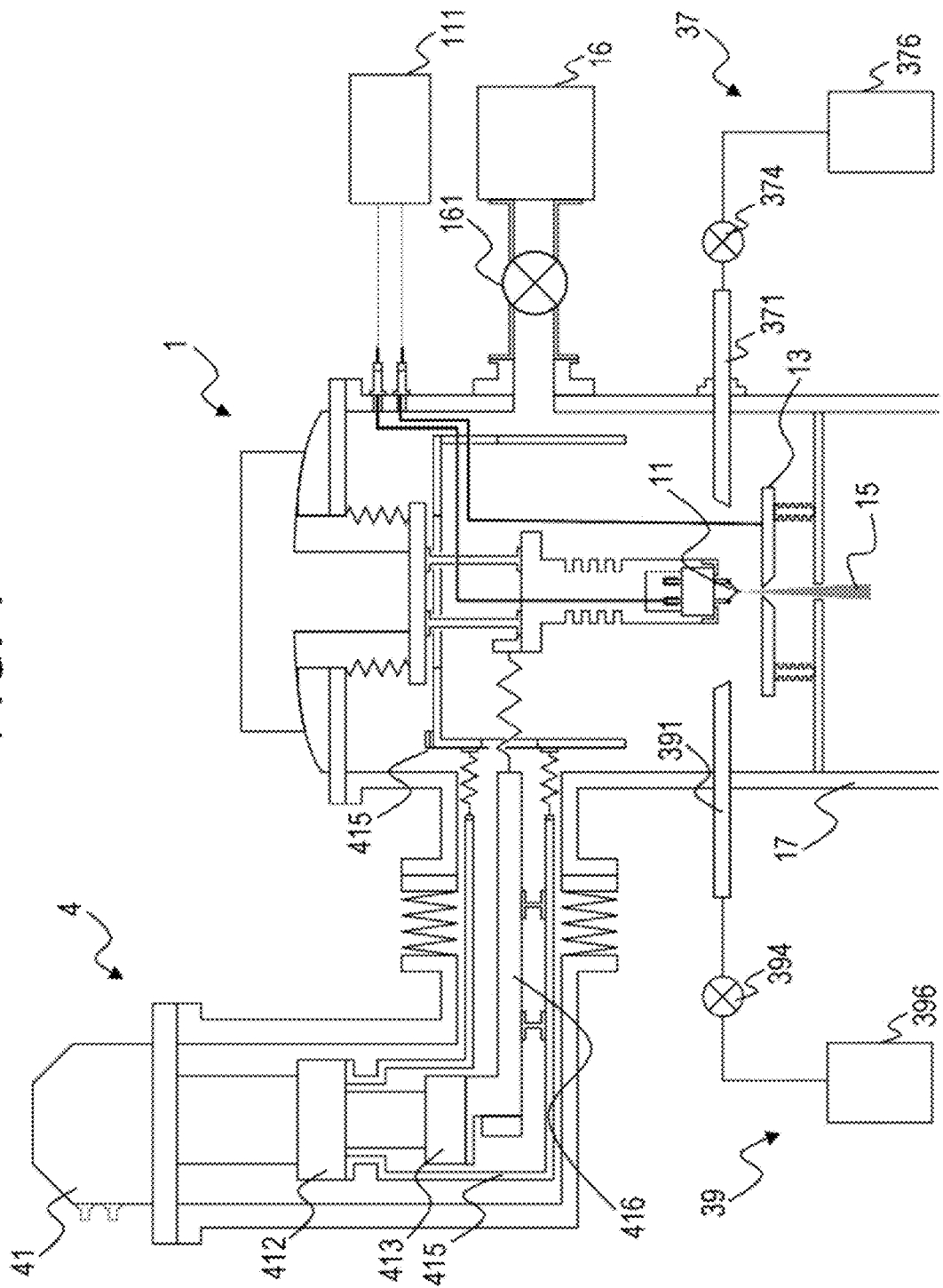
FIG. 1 is a side cross-sectional view showing a configuration of a gas field ionization source according to a first embodiment.

Regarding Basic Principle of the Present Invention

In order to facilitate the understanding of the present invention, first, a basic principle of the present invention will be described below. Hereinafter, a specific configuration of an ion beam apparatus according to the embodiment of the present invention will be described below with reference to the drawings.

The present inventors have studied for practical use of an apparatus using a hydrogen ion beam. During the study, the inventors found that as a result of terminating a point of an emitter tip with one atom and measuring an ion current (probe current) by introducing hydrogen gas, a first peak (maximum) appears, and then a second peak (maximum) appears within a range of an extraction voltage before an atom at the point of the emitter tip disappears due to the phenomenon called the electric field evaporation. The phenomenon (the phenomenon that the second peak exists after the first peak (maximum)) was not observed when the point of the emitter tip is terminated with one atom and the helium gas is introduced.

As a result of further analyzing the phenomenon, it was found that (1) ions forming the ion beam at the first peak are mainly $H^+$ or $H_2^+$, ions forming the ion beam at the second peak are mainly $H_3^+$, and (2) an energy width of $H_3^+$ which is the main component at the second peak is smaller than that of $H^+$ or $H_2^+$ which is the main component at the first peak. This means that an $H_3^+$ ion beam is focused more narrowly than an $H^+$ or $H_2^+$ beam, that is, high resolution can be obtained.

Further, it was found that even when gases (for example, gases capable of generating ions heavier than $H_3^+$ such as helium, neon, argon, krypton, xenon, nitrogen, and oxygen) other than hydrogen gas are mixed and introduced into the GFIS under the conditions that $H_3^+$ is mostly emitted, the stability of the ion current of $H_3^+$ is not impaired and the influence on SIM observation is small.

In the conventional hydrogen GFIS, optical conditions are adjusted under the premise that the observation or processing is made using $H^+$ or $H_2^+$ which is the first peak. Accordingly, it is usually not conceivable to set a voltage equal to or higher than the first peak. That is, if a voltage equal to or higher than the first peak is applied, it is highly likely to adhere other gases to the emitter tip to reduce the ion beam current, or field-evaporate the atom at the point of the emitter tip which is formed with considerable effort. In addition, it is usual to terminate the point of the emitter tip with one atom to increase the luminance of the ion beam, but it was not usually considered to change ion species to increase the luminance of the ion beam. Therefore, the present invention is a novel invention which was born based on the knowledge acquired by analyzing in detail the phenomenon discovered under the conditions which were not conventionally assumed to be used.

The energy width of the $H_3^+$ ions is smaller than the $H_2^+$ ions extracted under the normal conditions as described above. When the gas field ionization source is applied to the ion beam apparatus, the observation resolution or the processable width can be excellent, the damage at the time of the observation of the sample can be reduced as compared with the case of irradiating with the He ions, and the time taken to reproduce the shape of the emitter tip can be reduced as compared with the case of emitting the He ions.

When the $H_3^+$ ions are irradiated with beams with the same acceleration energy as compared with the $H_2^+$ ions, since energy of one hydrogen atom becomes ⅔, the damage (for example, mixing or the like) to the sample relying on the energy amount can be expected to be smaller. In addition, since the $H_3^+$ ion beam has a small energy width, the same focusing performance can be achieved at an acceleration lower than the $H_2^+$ ion. As a result, since it is possible to perform irradiation with the beam at the low acceleration, the damage to the sample can be reduced.

The inventors discovered an ion emission method in which the emission ratio of the $H_3^+$ ions becomes largest in the gas field ionization source. Although the phenomenon of emitting the $H_3^+$ has been known per se, the condition that the emission ratio of $H_3^+$ in hydrogen ion species is highest is not known so far. The above condition is the condition that the point of the emitter tip is terminated with 3 atoms or less, most preferably 1 atom, and the ion source is operated with the extraction voltage at which the probe current becomes the second peak. In other words, it is more effective if the point of the emitter tip is terminated with two atoms rather than terminated with three atoms, and in particular, the improvement effect of the emission ratio is largest in the case in which the point is terminated with a single atom.

The inventors found that even when other types of gases (for example, helium, neon, argon, krypton, xenon, nitrogen, oxygen, or the like) other than hydrogen are introduced into the GFIS simultaneously with hydrogen gas in the ion emission state in which the emission ratio of the $H_3^+$ ions becomes largest, the stability of the $H_3^+$ ion current is kept constant without being impaired. It is well known that when impurity gas exists in the GFIS, the impurity gas is adsorbed and desorbed to and from the surface of the emitter tip to increase or decrease the supply of ionized gas to the point of the emitter tip or the electric field of the point of the emitter tip is disturbed to impair the stability of the ion current. By using the present method, even when the impurity gases are simultaneously supplied, the ion current can be kept stably. The stability against the gas mixing of $H_3^+$ seems to stem from the unique ionization process of $H_3^+$ which is different from the field ionization of other gas species, or the reducibility of hydrogen gas.

Thanks to the resistance against the gas mixing of $H_3^+$, the following can be realized. For example, it is possible to switch between the $H_3^+$ ion beam and other ion beams at a relatively high speed and stably emit the $H_3^+$ ion beam by simultaneously introducing hydrogen gas and gases (for example, gases such as helium, neon, argon, krypton, xenon, nitrogen, and oxygen) other than hydrogen gas into the GFIS and switching between an extraction voltage value imparting an emission field of $H_3^+$ and an extraction voltage value imparting an emission field of other ions.

Since the resistance against the gas mixing of $H_3^+$ makes it unnecessary to perform evacuation required in the related art at the time of switching ion species, the time taken to switch the ion species can be shortened. For example, when ions are emitted by introducing the gases such as helium, neon, argon, krypton, xenon, nitrogen, and oxygen into the GFIS, it is considered to switch the ion beam types to $H_3^+$. In this case, the emission of $H_3^+$ may start by changing the extraction voltage simultaneously with introducing the hydrogen gas before the evacuation in the vicinity of the emitter tip ends. Even in this way, the stability of $H_3^+$ is not impaired.

On the other hand, the ion beam apparatus may be configured to be able to freely adjust the mixing ratio by introducing the mixed gas of hydrogen gas and gases (for example, gases such as helium, neon, argon, krypton, xenon, nitrogen, and oxygen) other than the hydrogen gas by installing one gas inlet to the GFIS, instead of individually introducing each of the gases into the GFIS. It is possible to reduce manufacturing costs of the ion beam apparatus by using one inlet.

First Embodiment: Apparatus Configuration

FIG. 1 is a side cross-sectional view showing a configuration of a gas field ionization source 1 according to a first embodiment of the present invention. The gas field ionization source 1 includes an emitter electrode (emitter tip) 11, an extraction electrode 13, a refrigerator 4, a vacuum chamber 17, an evacuation device 16, a gas supplier (gas introduction mechanism) 37, and a high voltage power supply 111. The emitter electrode 11 has a needle-like point. The extraction electrode 13 has an opening at a position opposite to the emitter electrode 11. The refrigerator 4 cools the emitter electrode 11. The refrigerator 4 has a refrigerator main body 41, and the refrigerator main body 41 has a first stage 412 and a second stage 413. The vacuum chamber 17 houses the emitter electrode 11/extraction electrode 13/first stage 412/second stage 413. The evacuation device 16 evacuates the vacuum chamber 17. The gas supplier 37 supplies gas containing hydrogen gas to an inside of the vacuum chamber 17. The high voltage power supply 111 applies a voltage between the emitter electrode 11 and the extraction electrode 13 to form an electric field for positively ionizing gas in the vicinity of the point of the emitter electrode 11. By controlling the voltage of each electrode independently, the extraction voltage for forming the acceleration of the ion beam and the ionization electric field may also be controlled independently.

When an ion beam 15 is emitted from the emitter tip 11, first, a high voltage is applied between the emitter tip 11 and the extraction electrode 13. By applying the high voltage, an electric field concentrates on the point of the emitter tip 11. The hydrogen ion beam is emitted from the point of the emitter tip 11 by introducing the hydrogen gas from the gas supplier 37 into the vacuum chamber 17 in the state in which the strength of the electric field formed at the point is sufficient for the positive ionization of hydrogen. Reference numeral 161 is a flow rate adjustor, reference numeral 371 is a gas nozzle, reference numeral 374 is a flow rate adjustor, reference numeral 376 is a gas cylinder, reference numeral 415 is a thermal radiation shield, and reference numeral 416 is a heat transfer mechanism.

It is also possible to introduce gases other than hydrogen into the vicinity of the emitter tip 11. As shown in FIG. 1, a gas supplier 39 may be provided in addition to the gas supplier 37. The gas supplier 39 includes a flow rate adjustor 394, a gas nozzle 391, and a gas cylinder 396. If necessary, a means for purifying gas or the like may be provided. The gas supplier 39 can introduce gases (for example, gases such as helium, neon, argon, krypton, xenon, nitrogen, and oxygen) other than hydrogen into the vicinity of the emitter tip 11. It is possible to introduce gas into the vacuum chamber 17 at a desired mixing pressure ratio by the flow rate adjustor 374 and the flow rate adjustor 394.

When the gases such as helium, neon, argon, krypton, xenon, nitrogen, and oxygen are introduced simultaneously with the hydrogen, the high voltage applied between the emitter tip 11 and the extraction electrode 13 is applied so that other gases have a value suitable to be ionized at the point of the emitter tip 11, such that the ion beam emitted from the point of the emitter tip 11 can be switched from the hydrogen ion beam to other ion beams.

Figure 2:
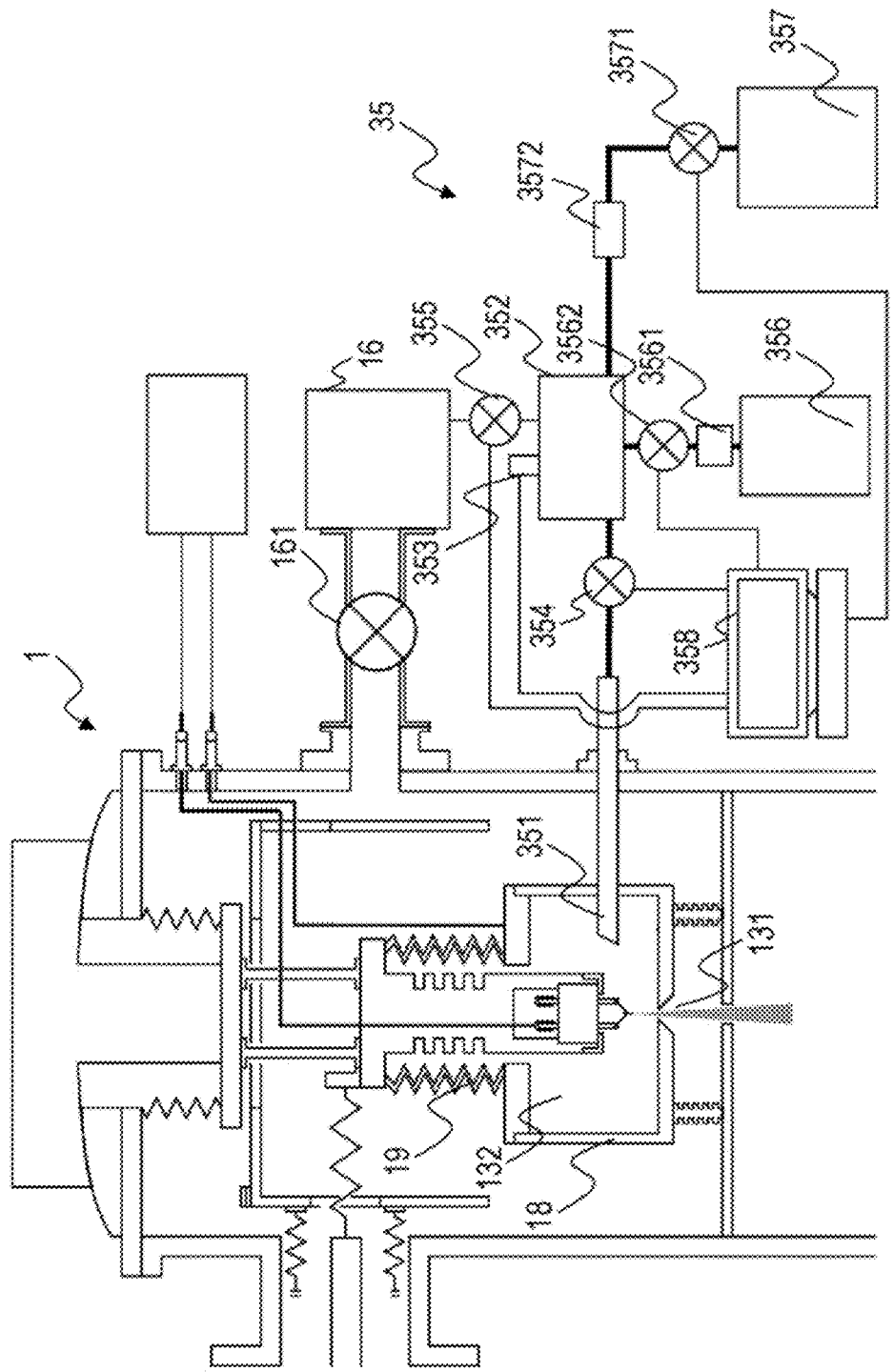
FIG. 2 is a view showing a modification of gas suppliers.

FIG. 2 is a view showing a modification of the gas suppliers 37 and 39. The gas field ionization source 1 shown in FIG. 2 includes a gas supplier 35 instead of the gas suppliers 37 and 39. The gas supplier 35 includes a gas nozzle 351, a gas mixer 352, a pressure gauge 353, a flow rate adjustor 354, a hydrogen gas cylinder 356, a gas cylinder 357 for storing gases other than hydrogen gas, a hydrogen gas filter 3561, a flow rate adjustor 3571, a flow rate adjustor 3562, a filter 3572, and a valve 355.

When the mixed gas having a desired gas mixing ratio is stored in the gas mixer 352, the evacuation device 16 once evacuates the gas mixer 352 via the valve 355. After the evacuation device 16 evacuates the gas mixer 352, the hydrogen gas is introduced into the gas mixer 352 via the flow rate adjustor 3562 while the pressure gauge 353 measures a pressure inside the gas mixer 352. After the purity of the hydrogen gas is improved by the hydrogen gas filter 3561 before being introduced, the hydrogen gas may be introduced into the gas mixer 352. The hydrogen gas filter 3561 can be configured as a membrane transmission type filter having a metal film containing palladium.

After the hydrogen gas is introduced into the gas mixer 352, gases other than the hydrogen are introduced into the gas mixer 352 via the flow rate adjustor 3571 while the pressure gauge 353 measures the pressure inside the gas mixer 352. The pressure gauge 353 may indicate an absolute pressure of the gas mixer 352 irrespective of the mixing ratio or a pressure gauge having a mass analysis function capable of directly measuring the mixing ratio may be used.

By the above process, it is possible to generate gas with a desired mixing ratio inside the gas mixer 352. The above process may be performed by allowing the mixing ratio controller 358 to automatically control each flow rate adjustor. In addition, the mixing ratio controller 358 may automatically read an indication value of the pressure gauge 353.

The gas mixing ratio of the gas mixer 352 can be determined by matching information on each component of the ion beam apparatus, such as types of gases, gas conductance from the gas mixer 352 to the gas nozzle 351, gas conductance of an extraction electrode hole 131, and a cooling temperature of the emitter tip 11, with a user indication.

When the user performs only the sample observation, the user instructs the mixing ratio controller 358 via a user interface. The user interface can be provided, for example, via a display or the like included in the mixing ratio controller 358 itself or provided via another suitable computer or the like. When receiving the instruction, the mixing ratio controller 358 introduces the hydrogen gas into the gas mixer 352 at a ratio of approximately 100%.

When the user performs only the sample processing, the user instructs the mixing ratio controller 358 via the user interface to introduce the hydrogen gas. When receiving the instruction, the mixing ratio controller 358 introduces only heavy gases such as neon and argon into the gas mixer 352 at a ratio of approximately 100%.

When the user alternately uses the observation and the processing, the user instructs the mixing ratio controller 358 via the user interface to introduce the heavy gases. When receiving the instruction, the mixing ratio controller 358 controls the mixing ratio in the gas mixer 352 so that the gas mixing ratio of the hydrogen gas and other gases (for example, heavier gases, such as helium, neon, argon, krypton, xenon, nitrogen, and oxygen, than hydrogen) in an ion source interior 132 is 1:1. This is because these gases are equally used. Specifically, the gas mixing ratio can be determined based on a function prescribed beforehand according to parameters on each component of the ion beam apparatus, such as the types of gases, the gas conductance from the gas mixer 352 to the gas nozzle 351, the gas conductance of the extraction electrode hole 131, and the cooling temperature of the emitter tip 11. It is not necessary to set the gas mixing ratio to be 1:1 depending on various conditions such as an observation object, and the appropriate gas mixing ratio may be used.

The user can indicate a desired ion current value for the hydrogen ion beam and other ion beams via the user interface. When receiving the instruction, the mixing ratio controller 358 controls the gas mixing ratio in the ion source interior 132 so that the ion current value is obtained. Specifically, the gas mixing ratio can be determined based on a function prescribed beforehand according to parameters on each component of the ion beam apparatus, such as the types of gases, the gas conductance from the gas mixer 352 to the gas nozzle 351, the gas conductance of the extraction electrode hole 131, and the cooling temperature of the emitter tip 11. By this mixing ratio, the ion current value designated by the user can be realized.

The ion current value before and after switching the ion beam type should be larger for heavy ions for sample processing than $H_3^+$. When $H_3^+$ is used for the observation of the surface of the sample, to reduce the damage to the sample, the current amount needs to be suppressed to the required minimum. On the other hand, since the processing rate is important in the processing, it is generally preferable that the ion current is as large as possible. For example, in the case of a combination of $H_3^+$ and $Ar^+$, it is known (in the case in which the sample is silicon) that the amount of sputtering on the surface of the sample is about 100 times by setting the ion current amount of $Ar^+$ to be 3 times the ion current amount of $H_3^+$. That is, by setting the ion current at the time of the processing to be 3.0 times or more the ion current at the time of the observation, the sample sputtering at the time of the observation by $H_3^+$ may be almost ignored, and only the processing by the irradiation of $Ar^+$ may be considered.

First Embodiment: Details of Apparatus

Figure 3B:
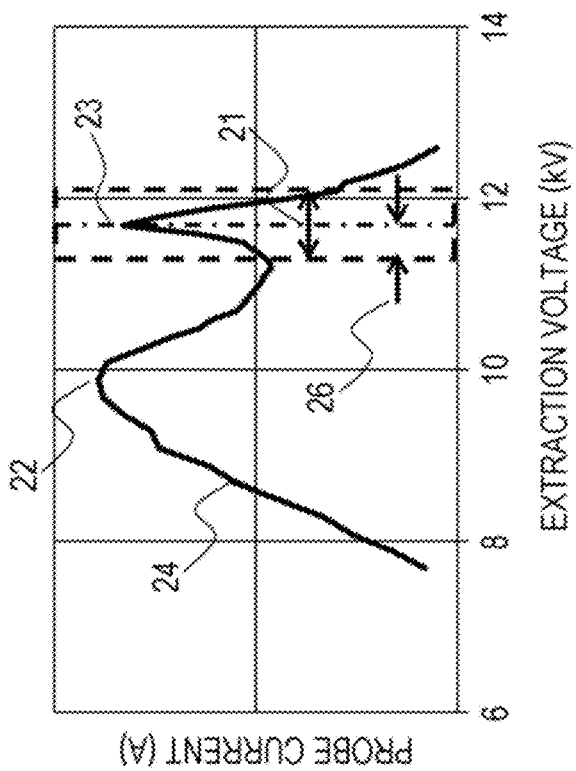
FIG. 3B is a graph showing a relationship between a probe current value and an extraction voltage in FIG. 3A.
Figure 3A:
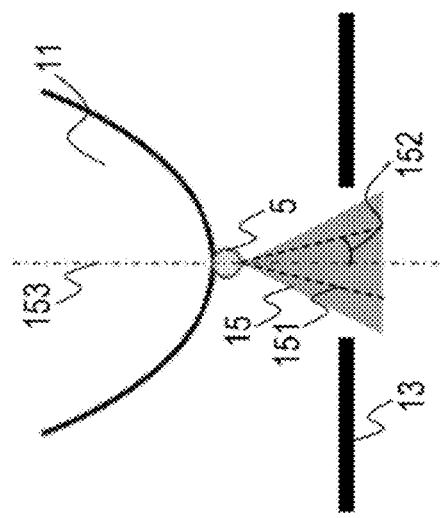
FIG. 3A is a side view showing an enlarged aspect of a point part of an emitter tip.

FIG. 3A is a side view showing an enlarged aspect of a point part of an emitter tip 11. In FIG. 3A, a point 5 of the emitter tip 11 is terminated with one atom. Reference numeral 151 represents a probe current, reference numeral 152 represents a beam limiting aperture angle, and reference numeral 153 represents an optical axis 153. The probe current 151 limits the ion beam 15 extracted from the gas field ionization source 1 to a certain radiation angle.

FIG. 3B is a graph showing a relationship between a probe current value 24 and an extraction voltage in FIG. 3A. When the point 5 of the emitter electrode 11 is terminated with 3 or less atoms, the probe current value 24 is changed with respect to the extraction voltage (the voltage applied between the emitter electrode 11 and the extraction electrode 13) as shown in FIG. 3B.

The value of the electric field generated by the extraction voltage at the point of the emitter electrode 11 differs depending on the shape represented by the radius of curvature or the like of the point of the emitter electrode 11 even if for example, the value of the extraction voltage is the same. In addition, the phenomenon revealed in the first embodiment is due to the electric field generated at the point. In other words, herein, for the sake of convenience, explanation will be made by using the experimental results when confirming the effect of the first embodiment, but the absolute value of the extraction voltage shown herein can be changed without deviating from the idea, and the extraction voltage value exemplified does not limit the scope of the present invention.

In the example shown in FIG. 3B, the probe current value 24 has a first maximum 22 at an extraction voltage of about 10 kV, and has a second maximum 23 at an extraction voltage value of about 11.68 kV which is higher than the extraction voltage imparting the first maximum (peak) 22. The inventors found that the emission ratio of $H_3^+$ ions was higher than the other hydrogen ion $H^+$ or $H_2^+$ in the vicinity of the extraction voltage imparting the second maximum 23. Specifically, it means that a voltage range 21 is preferably ±5% with respect to the absolute value of the extraction voltage imparting the second maximum 23. In the example shown in FIG. 3B, it means that the extraction voltage is preferably set within a range from 11.1 kV to 12.26 kV, centered on the extraction voltage imparting the second maximum 23 of 11.68 kV.

Figure 3D:
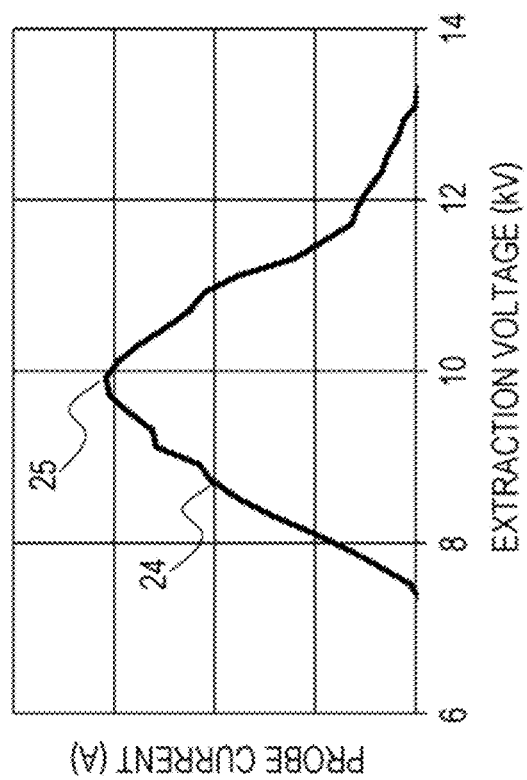
FIG. 3D is a graph showing a relationship between the probe current value and the extraction voltage in FIG. 3C.
Figure 3C:
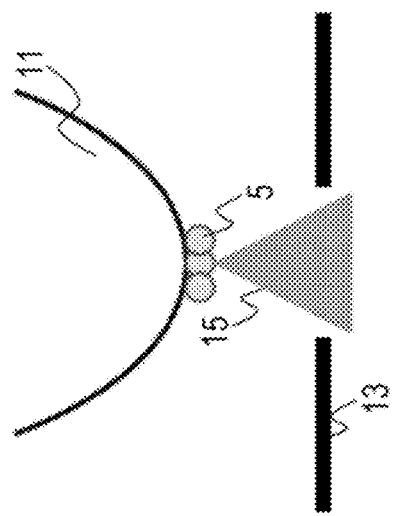
FIG. 3C is a side view showing an enlarged aspect of the point part of the emitter tip.

FIG. 3C is a side view showing an enlarged aspect of a point part of an emitter tip 11. In FIG. 3C, the point 5 of the emitter tip 11 is terminated with four or more atoms. The others are the same as FIG. 3A.

FIG. 3D is a graph showing the relationship between the probe current value 24 and the extraction voltage in FIG. 3C. When the point 5 of the emitter electrode 11 is terminated with four or more atoms, the probe current value 24 is changed as shown in FIG. 3D with respect to the extraction voltage. In other words, the probe current value 24 has a unique maximum (peak) 25 at an extraction voltage of about 10 kV. Unlike the example shown in FIG. 3B, the emission of $H_3^+$ ion over the whole extraction voltage is not observed on the graph and the ratio of $H_3^+$ does not exceed another hydrogen ion $H^+$ or $H_2^+$. On the lower voltage side than the maximum 25, the emission ratio of $H_2^+$ is larger and on the higher voltage side, the emission ratio of $H^+$ is increased.

The emission ratio of the $H_3^+$ ion beam in the vicinity of the second maximum 23 of the probe current value 24 is higher when the number of atoms at the point 5 is small. In other words, when the number of atoms is 2 rather than 3, the emission ratio is high, and the state of one atom is most preferable to increase the emission ratio of the $H_3^+$ ion beam.

Figure 4A:
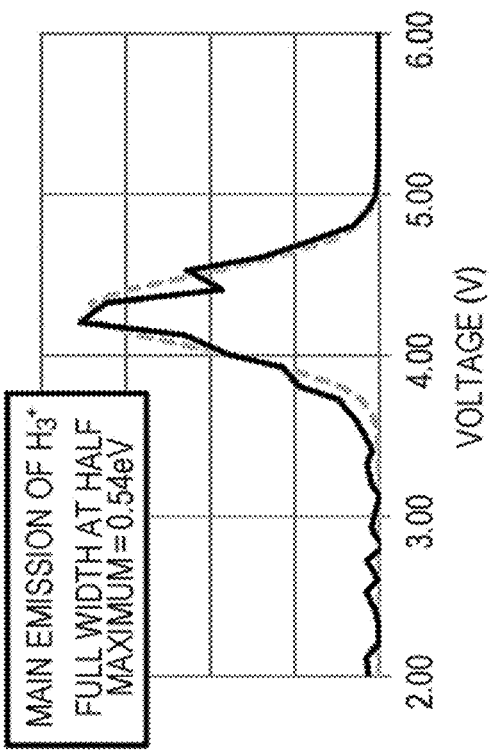
FIG. 4A shows an example of an energy width of an ion beam measured at the extraction voltage lower than a maximum.

FIG. 4A shows an example of an energy width of an ion beam measured at the extraction voltage lower than the maximum 25. $H_2^+$ is mostly emitted at the extraction voltage lower than the maximum 25. In this case, a full width at half maximum of energy was 0.96 eV.

Figure 4B:
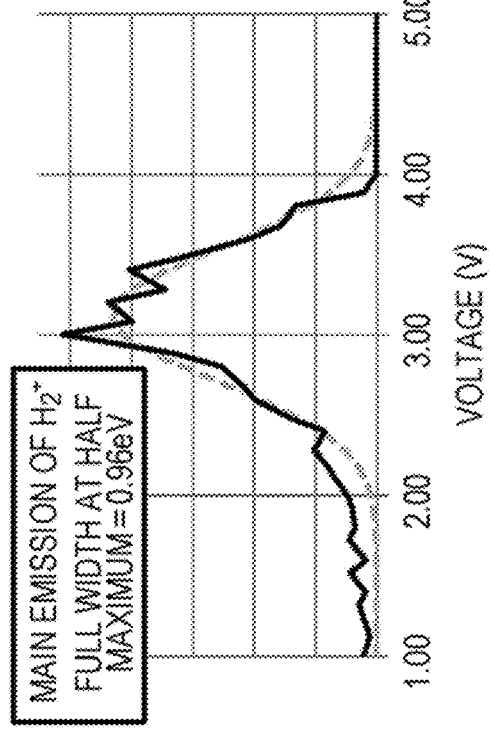
FIG. 4B shows an example of an energy width of an ion beam measured at the extraction voltage in the vicinity of a second maximum.

FIG. 4B shows an example of an energy width of an ion beam measured at the extraction voltage in the vicinity of the second maximum 23. $H_3^+$ is mostly emitted in the vicinity of the second maximum 23. In this case, the full width at half maximum of energy was 0.54 eV.

As shown in FIGS. 4A and 4B, the inventors found that the energy width of the $H_3^+$ ion beam is smaller than those of other hydrogen ions ($H^+$ ions and $H_2^+$ ions). In other words, compared with the ion beam apparatus including the gas field ionization source which emits the helium ion beam, the ion beam apparatus including the gas field ionization source 1 which emits the $H_3^+$ ion beam can reduce the damage to the sample due to the irradiation with the ion beam without deteriorating the observation resolution or increasing the processable width. In this case, if the ratio of $H_3^+$ ions among the ion beams with which the sample is irradiated is highest, the influence due to beams of other hydrogen ions ($H^+$ ions and $H_2^+$ ions) is reduced, which is more suitable.

The inventors found that there is a change in the energy width of the ion beam even in the above region in which the emission ratio of $H_3^+$ ions is high. In other words, it was found that an ion beam extracted with an extraction voltage in a range 26 has an energy width smaller than that of the ion beam extracted with the extraction voltage corresponding to the second maximum 23 and the extraction voltage within a range of 5% larger than the second maximum 23. Therefore, the extraction voltage may be set within a range (range 26 in FIG. 3B) that is preferably 5% lower than the absolute value of the extraction voltage corresponding to the second maximum 23. In the example shown in FIG. 3B, it means that the extraction voltage is preferably set within a range from 11.1 kV to 11.68 kV with respect to the second maximum 23=11.68 kV.

In order to improve the emission ratio of $H_3^+$ ions, a metal having a body-centered cubic lattice structure or a hexagonal close-packed structure may be used as the metal material of the emitter electrode 11. Examples of the metal may include tungsten, tantalum, molybdenum, niobium, rubidium, ruthenium, titanium, beryllium, and the like. Alternatively, iridium, tantalum, or the like which is excellent in chemical resistance may be used. By using the metal having the excellent chemical resistance, the effect of erosion of the emitter electrode 11 due to the ionized gas or impurity gas contained in the ionized gas can be suppressed, and the ion source is expected to be stably operated. The inventors confirmed the above phenomenon of improving the emission ratio of $H_3^+$ ions using the emitter electrode 11 in which <111> orientation of tungsten becomes a major axis direction.

The fact that the point 5 is terminated with one atom means that there is no atom adjacent to the atom on a crystal plane of the emitter electrode 11 where the atom emitting the ion beam with which the sample is irradiated exists. In the GFIS, an atom emitting an ion beam to the surface of the emitter electrode 11 may exist in plural, and the ion beams may be emitted at different angles from each atom. For example, there is the case in which the helium ion beam is emitted from each of three adjacent atoms on a crystal surface of the <111> orientation of tungsten. In the first embodiment, the fact that the point 5 is terminated with one atom means that atoms emitting an ion beam having the same amount of current are not adjacent to each other. For example, it is considered that (a) the ion beam is emitted from a surface protrusion of the emitter electrode 11 formed by adsorbing gas molecules to a position separated from atoms emitting the ion beam with which the sample is irradiated, and (b) the ion beam is emitted from an end surface portion of the crystal plane of a lower layer by a single layer which holds the atom. In the first embodiment, even in this case, it is assumed that the point 5 is terminated with one atom. Therefore, for example, an atom bonded/adjacent to the atom on a lower layer by a single layer of the crystal plane does not correspond to an adjacent atom on the crystal plane.

Figure 5A:
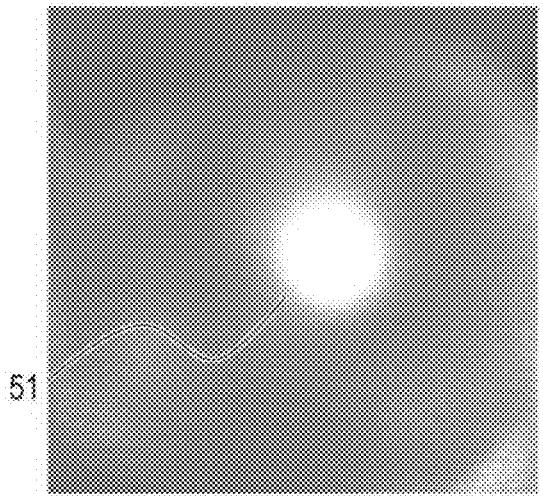
FIG. 5A shows an atomic image of a point shape of an emitter electrode acquired by a field ion microscope.

FIG. 5A shows an atomic image of the point shape of the emitter electrode 11 acquired by a field ion microscopy (abbreviated as FIM). As shown in FIG. 5A, the point 5 is terminated with one atom 51. This corresponds to FIG. 3A. The inventors actually confirmed the conditions as shown in FIG. 3B where $H_3^+$ ions are emitted at a high ratio using the point shape shown in FIG. 5A.

Figure 5B:
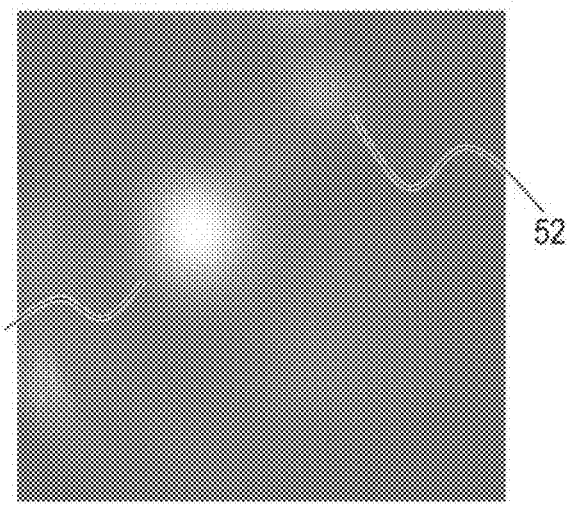
FIG. 5B shows an example in which an atom exists in the vicinity of an atom.

FIG. 5B shows an example in which an atom 52 exists in the vicinity of an atom 51. Even if the atom 52 emits a sufficiently small ion current with respect to the ion current emitted from the atom 51, if the atom 52 is sufficiently separated from the atom 51, $H_3^+$ ions can be emitted from the atom 51 at a high ratio.

Figure 5C:
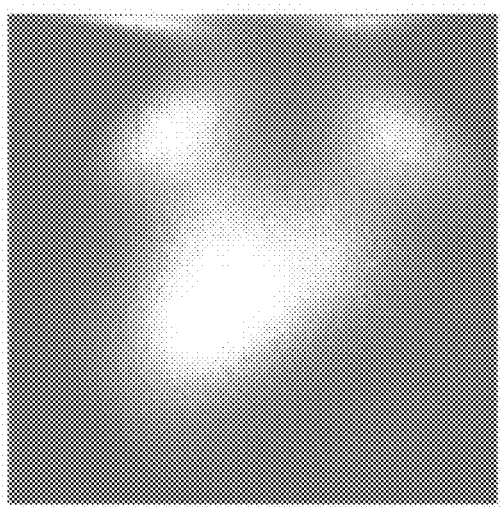
FIG. 5C shows an example in which the point of the emitter electrode is terminated with four or more atoms.
Figure 5D:
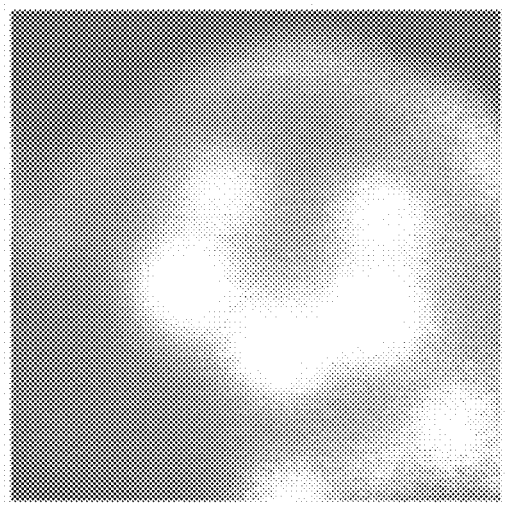
FIG. 5D shows an example in which the point of the emitter electrode is terminated with four or more atoms.

FIGS. 5C and 5D are diagrams showing an example in which the point of the emitter electrode 11 is terminated with four or more atoms. This shape corresponds to FIG. 3C. The inventors actually confirmed that when the point shapes shown in FIGS. 5C and 5D are used, the voltage condition that $H_3^+$ ions are emitted at a high ratio does not exist. That is, it is confirmed that the probe current value 24 is changed as shown in FIG. 3D.

In order to improve the emission ratio of $H_3^+$ ions, the ion current extracted from the point 5 of the emitter electrode 11 can also be limited by a certain beam limiting aperture angle 152 with respect to the optical axis 153. The probe current 151 limited by the beam limiting aperture angle 152 can be expected to improve the emission ratio of $H_3^+$ ions as compared with the case in which the probe current 151 is not limited. The magnitude of the probe current 151 corresponds to the probe current value 24. Preferably, the beam limiting aperture angle 152 may be set to be 5 mrad or less. For example, when an extraction voltage with a high emission ratio of $H_3^+$ ions is set, the electric field at points of atoms (for example, atom 52) existing at different spots of the same tip is different from that at the atom 51. Therefore, the ion beam from the atom 52 may have the possibility that the emission ratio of $H_3^+$ ions is small. The inventors confirmed that by setting the beam limiting aperture angle 152 to be 5 mrad or less, the phenomenon that $H^+$ ions and $H_2^+$ ions emitted from an atom such as the atom 52 are mixed can be reduced. Even when the ion beam is emitted only from the atom 51 and an emission angle of $H^+$ ions and $H_2^+$ ions is larger than that of $H_3^+$ ions, it is possible to reduce the mixing of the $H^+$ ions and $H_2^+$ ions by reducing the beam limiting aperture angle 152. When the beam limiting aperture angle 152 is sufficiently large, the probe current 151 coincides with the ion beam 15.

In order to increase the luminance of the $H_3^+$ ion beam and to stabilize the ion emission, it is preferable to adjust the cooling temperature of the emitter tip 11 by the refrigerator 4. The emission ratio of $H_3^+$ ions can be adjusted to some extent by adjusting the cooling temperature. In the example shown in FIGS. 3A to 3D, the emitter electrode 11 is cooled to approximately 40 K. The refrigerator 4 cools the inside of the gas field ionization source 1, the emitter electrode 11, the extraction electrode 13, and the like. The refrigerator 4 can use, for example, a mechanical refrigerator such as a Gifford McMahon type (GM type) and a pulse tube type, or a refrigerant such as liquid helium/liquid nitrogen/solid nitrogen. FIG. 1 shows an example of a configuration using the mechanical refrigerator. The heat from the second stage 413 is transferred to the emitter electrode 11, the extraction electrode 13, or the like by the heat transfer mechanism 416, and these components are cooled.

The first stage 412 having cooling temperature lower than that of the second stage 413 may be configured to cool the thermal radiation shield 415. The thermal radiation shield 415 is configured to cover the second stage, more preferably the emitter electrode 11 or the extraction electrode 13. The influence of thermal radiation from the vacuum chamber 17 can be reduced by the radiation shield 415 and the second stage 413, the emitter electrode 11, the extraction electrode 13, and the like can be efficiently cooled.

The heat transfer mechanism 416 can be made of a metal having good thermal conductivity such as copper, silver, or gold. In order to reduce the influence of thermal radiation, a surface treatment (for example, gold plating or the like) may be performed so that the surface has metallic luster. If vibrations generated by the refrigerator 4 are transmitted to the emitter electrode 11, since there is an influence such as the deterioration in the resolution of the sample observation image due to the ion beam, a part of the heat transfer mechanism 416 may be configured using a component having flexibility like a metallic stranded wire that is less likely to transmit vibrations. For the same reason, the heat transfer mechanism 416 may be configured to circulate gas or liquid cooled by the refrigerator 4 to transfer heat to the emitter electrode 11 and the extraction electrode 13. In such a configuration, the refrigerator 4 can be installed at a position separated from the ion beam apparatus main body.

The first stage 412, the second stage 413, and the heat transfer mechanism 416 may be provided with a means for adjusting the temperature. If the temperature of the emitter electrode 11 is adjusted by the means for adjusting the temperature so that the luminance of the $H_3^+$ ion beam is increased, a signal noise ratio at the time of the sample observation, throughput at the time of the sample processing, and the like are improved.

In order to raise the luminance of the $H_3^+$ ion beam, it is preferable to optimize the pressure of the hydrogen gas introduced into the vacuum chamber 17. It is possible to adjust the emission ratio of $H_3^+$ ions to some extent by adjusting a gas pressure, in addition to adjusting a total ion current amount discharged from the emitter electrode 11 depending on the gas pressure. The pressure inside the vacuum chamber 17 is determined by the balance between the gas displacement by the evacuation device 16 and the flow rate of the introduced hydrogen gas. The gas displacement may be adjusted by installing a flow rate adjustor 161 between the evacuation device 16 and the vacuum chamber 17. If the purity of the hydrogen gas is sufficiently high, the operation of the gas field ionization source 1 is stabilized. If necessary, the filter for increasing the purity of the hydrogen gas may be used.

If gas is introduced at a high gas pressure from the gas supplier 37 (or 35 and 39) over the whole of the inside of the vacuum chamber 17, heat exchange is generated through the gas introduced between the emitter electrode 11 and the vacuum chamber 17. This causes problems such as insufficient cooling of the emitter electrode 11 and dew condensation of the vacuum chamber 17. In addition, if the gas pressure is high over the entire optical path of the ion beam 15 emitted from the emitter electrode 11, a problem arises that a part of the ion beam is scattered and the convergence of the beam deteriorates. In view of these, it is suitable to set the gas pressure to be introduced into the vacuum chamber 17 to be about 0.01 Pa.

When there is a need to further increase the introduced gas pressure, as shown in FIG. 2, the inside of the vacuum chamber 17 may be provided with an inner wall 18 surrounding the emitter tip 11. In this case, the inner wall 18 is configured to house the extraction electrode 13, and gas is introduced from the gas nozzle 371 into the inner wall 18 while maintaining the air tightness of portions other than a hole through which the ion beam 15 of the extraction electrode 13 passes. This may increase the gas pressure only around the emitter electrode 11. In addition, a deformable bellows 19 may be provided on a part of the inner wall 18 to maintain the function of changing the angle of the emitter tip 11. By such a configuration, it is possible to increase the gas pressure around the emitter electrode 11 from about 0.1 Pa to about 1 Pa. The upper limit of the gas pressure is due to the discharge phenomenon, and the gas pressure that can be introduced by a potential difference between the emitter electrode 11 and the extraction electrode 13 differs from the upper limit of the gas pressure. The inner wall 18 may be cooled by the refrigerator 4. Since the inner wall 18 surrounds the emitter electrode 11, if the inner wall 18 is cooled to the same extent as the emitter electrode 11, the influence of thermal radiation from the vacuum chamber 17 can be reduced. If the inside of the inner wall 18 is kept in an ultrahigh vacuum state, the entire vacuum chamber 17 is not necessarily kept in the ultrahigh vacuum state.

First Embodiment: Summary

The gas field ionization source 1 according to the first embodiment switches between the extraction voltage that mainly emits an $H_3^+$ ion beam and the extraction voltage that mostly emits ion beams other than the $H_3^+$ ion beam. Since the switching between the extraction voltages can be made in a short time, for example, the sample observation and the sample processing in the GFIS-SIM can be switched in a short time. Furthermore, since the $H_3^+$ ion beam is less affected by the gas mixing, it is possible to suppress the deterioration in the quality of the observation image.

Since the gas field ionization source 1 according to the first embodiment observes the sample using the $H_3^+$ ion beam, it is possible to reduce the damage to the sample as compared with the case of using the helium ion beam.

Second Embodiment

FIG. 6 is a side cross-sectional view showing a configuration of an ion beam apparatus 1000 according to a second embodiment of the present invention. The ion beam apparatus 1000 includes the gas field ionization source 1 described in the first embodiment, a beam irradiation column 7, a sample chamber 3, and other components. A sample 31 installed on a sample stage 32 inside the sample chamber 3 via the beam irradiation column 7 is irradiated with an ion beam 15 emitted from the gas field ionization source 1. Secondary particles emitted from the sample 31 are detected by a secondary particle detector 33.

The beam irradiation column 7 includes a focusing lens 71, an aperture 72, a first deflector 73, a second deflector 74, an objective lens 76, a mass filter 78, and a Faraday cup 79. In an optical system for irradiating the sample 15 with the ion beam 15, design parameters may be appropriately changed depending on which performance is emphasized. Therefore, the beam irradiation column 7 may further include a lens focusing the ion beam 15, a deflector deflecting the ion beam 15, and the like, if necessary, and the arrangement order thereof may be changed or any of the components may be removed.

The focusing lens 71 focuses the ion beam 15. The aperture 72 limits the ion beam 15 like the probe current 151. The objective lens 76 further focuses the ion beam 15 so that the ion beam 15 has a fine shape on the surface of the sample. The first deflector 73 and the second deflector 74 are used for axis adjustment to reduce convergence aberration by the lens, ion beam scanning on the sample, and the like.

The Faraday cup 79 can be connected to an ammeter 790 for measuring the current amount of the ion beam 15. The control device 791 controls a high voltage power supply 111 using the measurement results by the ammeter 790. For example, the control device 791 automatically adjusts an output of the high voltage power supply 111 so that the extraction voltage has a range in which the emission ratio of $H_3^+$ ions is high. The control device 791 can be configured using, for example, a computer, a microcomputer, an electronic circuit, or the like. The control device 791 may store the relationship between the ion beam current measured once and the extraction voltage in a storage medium. Since it is expected that the range of the extraction voltage in which the emission ratio of $H_3^+$ ions is high is not greatly changed unless the curvature radius or the like of the point of the emitter electrode 11 is largely changed, similar beam irradiation conditions can be reproduced using the stored parameters.

Since a position of a virtual light source generally moves by changing the extraction voltage, the optimum conditions for focusing the ion beam 15 (that is, operating parameters of the focusing lens 71, the aperture 72, the first deflector 73, the second deflector 74, and the objective lens 76) are also changed. Therefore, the optimum focusing conditions corresponding to each ion beam type are stored in the storage medium, and when the ion beam types are switched, the control device 791 may automatically set the focusing conditions corresponding to the switched ion beam types. For example, the control device 791 can change the focusing conditions by changing a voltage or a current which is output from a power supply 710 for the focusing lens, a power supply 730 for the first deflector, a power supply 740 for the second deflector, and a power supply 760 for the objective lens.

In addition, the control device 791 may also change, for example, an image shift amount of the observation image, a correction amount of astigmatism of the observation image, the position of the ion beam 15 incident on the objective lens 76, and the like at the time of switching the ion beam types.

The inventors found that although the focused state of the ion beam 15 is maintained to some extent before and after the switching of the ion beams by the change in the voltage of each component as described above, to optimize the focused state, it is sometimes necessary to change the conditions such as the angle and the position of the emitter tip 11 other than a voltage which have trouble instantly switching unlike a voltage. Furthermore, the inventors found that if the change in the extraction voltage is large at the time of switching the ion beams, the optimum focusing conditions are more remarkably changed. This is considered to be caused by the movement of the virtual light source position of the ion beam light source due to the change in the extraction voltage.

Therefore, the present inventors found from the new knowledge which cannot easily be inferred as described above that the combinations of the ion species without the difference in the extraction voltage among the combinations of the ion species at the time of switching the ion beam types under the premise that the ion beams are not mixed are suitable to rapidly switch ion beams. Specifically, the present inventors found that the combination of $H_3^+$ and $Ar^+$ is suitable for the rapid switching of the ion beams. According to our survey, the extraction voltage of $Ar^+$ was about 9 kV when the extraction voltage of $H_3^+$ was 11.7 kV. The difference in the extraction voltage was close to about 3 kV. This difference is 30% with respect to 11.7 kV, and is 23% with respect to 9 kV. In the extraction voltage, the movement of the virtual light source is almost negligible, and in the magnitude of the extraction voltage emitted by $H_3^+$, since most of the emission of $Ar^+$ is generated at a spot separated from the point of the emitter tip 11, the mixing of the ion beams 15 hardly occurs.

In addition to $Ar^+$, $Ne^+$ is also suitable. The extraction voltage of $H_3^+$ was 11.7 kV, whereas $Ne^+$ was 18.3 kV. The difference between the extraction voltages is 6.6 kV, which is 56% with respect to 11.7 kV, and 36% with respect to 18.3 kV.

If the ratio of the extraction voltages before and after switching the ion beam types is too small, the ions are mixed, and if the ratio of the extraction voltage is too large, there is a possibility that it will affect the focusing conditions of the optical system components. It is preferable that the difference between the extraction voltages before and after switching the ion beam types is in the range of approximately 10% to 50% based on either before or after the switching. The examples of $Ar^+$ and $Ne^+$ described above satisfy this range.

Figure 7A:
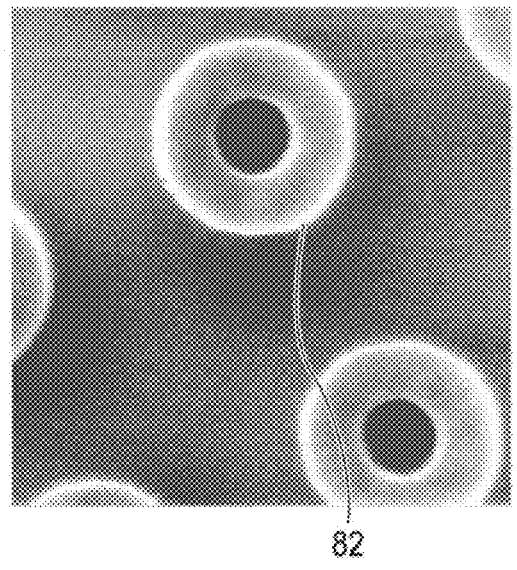
FIG. 7A shows an example of a scanned ion image when a sample is observed with an ion beam formed substantially only of $H_2^+$ ions.

FIG. 7A shows an example of a scanned ion image when a sample is observed with an ion beam formed of substantially only of $H_2^+$ ions. As indicated by reference numeral 82, only one type of edge contrast is observed.

Figure 7B:
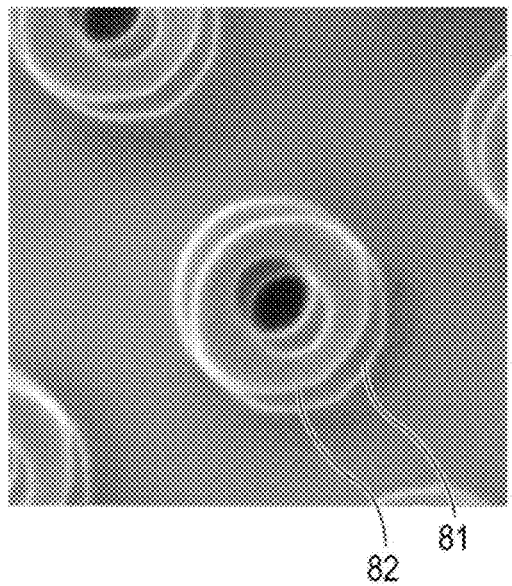
FIG. 7B shows an example of a scanned ion image when a sample is observed with an ion beam in which $H^+$ ions and $H_2^+$ ions are mixed.

FIG. 7B shows an example of a scanned ion image when a sample is observed with an ion beam in which $H^+$ ions and $H_2^+$ ions are mixed. In addition to the example in FIG. 7A, an edge contrast indicated by reference numeral 81 is superimposingly observed. This is due to the acquisition of the scanned ion image while trajectories of each ion beam are separated from each other due to a deflection action by a magnetic field.

Figure 7C:
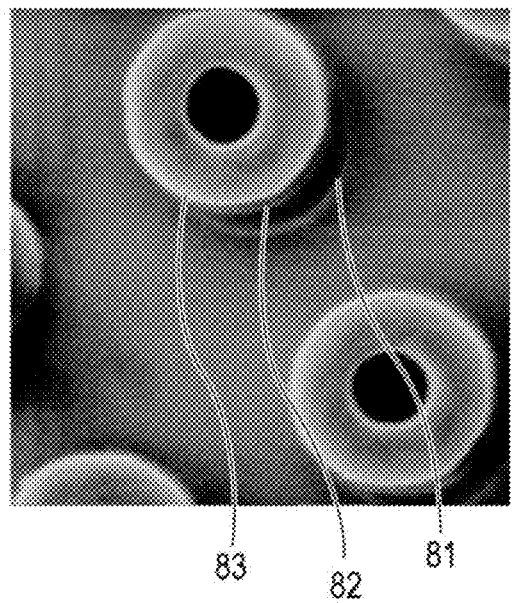
FIG. 7C shows an example of a scanned ion image when a sample is observed with an ion beam in which $H^+$ ions, $H_2^+$ ions, and $H_3^+$ ions are mixed.

FIG. 7C shows an example of a scanned ion image when a sample is observed with an ion beam in which $H^+$ ions, $H_2^+$ ions, and $H_3^+$ ions are mixed. In addition to the example in FIG. 7B, an edge contrast indicated by reference numeral 83 is superimposingly observed.

Figure 7D:
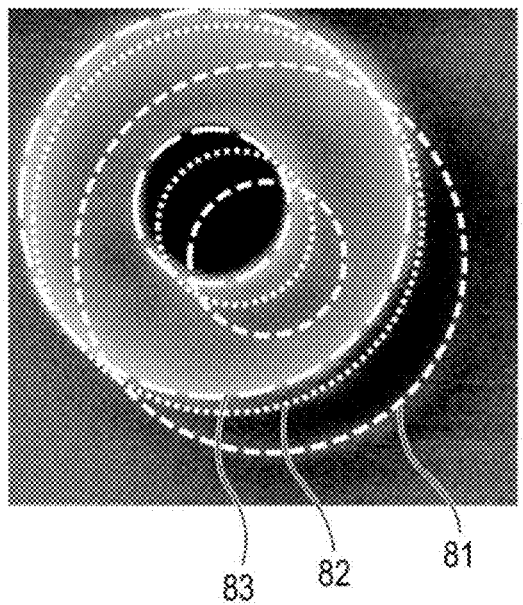
FIG. 7D is a partially enlarged image of FIG. 7C.

FIG. 7D is a partially enlarged image of FIG. 7C. The edge contrasts of the observation images corresponding to each ion are shown with being emphasized by a dotted line. As shown in FIG. 7D, the observation images obtained by each ion are observed with being displaced from each other due to the deflection action.

As shown in FIGS. 7A to 7D, if the scanned ion images are acquired while the trajectories of each ion are separated from each other by the deflection magnetic field, the structure of the surface of the sample is observed multiply. For example, since the phenomenon is outstanding in an edge portion of the unevenness of the sample, it is suitable for estimating the emission ratio of ion species. In the estimation, it is also preferable to take into consideration the difference in the emission amount of secondary electrons due to each ion species. It is possible to determine the extraction voltage having the high emission ratio of $H_3^+$ ions based on the contrast ratio.

It is possible to estimate which of the edge contrasts is based on the ion beam of which of the ion species based on a separation width of the edge contrast. $H_3^+$ ions having a large mass-to-charge ratio are less influenced by the deflection due to the magnetic field and $H^+$ ions having a smaller mass-to-charge ratio are greatly influenced by the deflection due to the magnetic field. In the example of FIG. 7C, it can be estimated that pairs of edge contrasts 81 and 83 having the largest difference in the separation width correspond to $H^+$ ions and $H_3^+$ ions, and pairs of edge contrasts 82 and 83 having the smallest difference in separation width correspond to $H_2^+$ ions and $H_3^+$ ions.

Figure 7E:
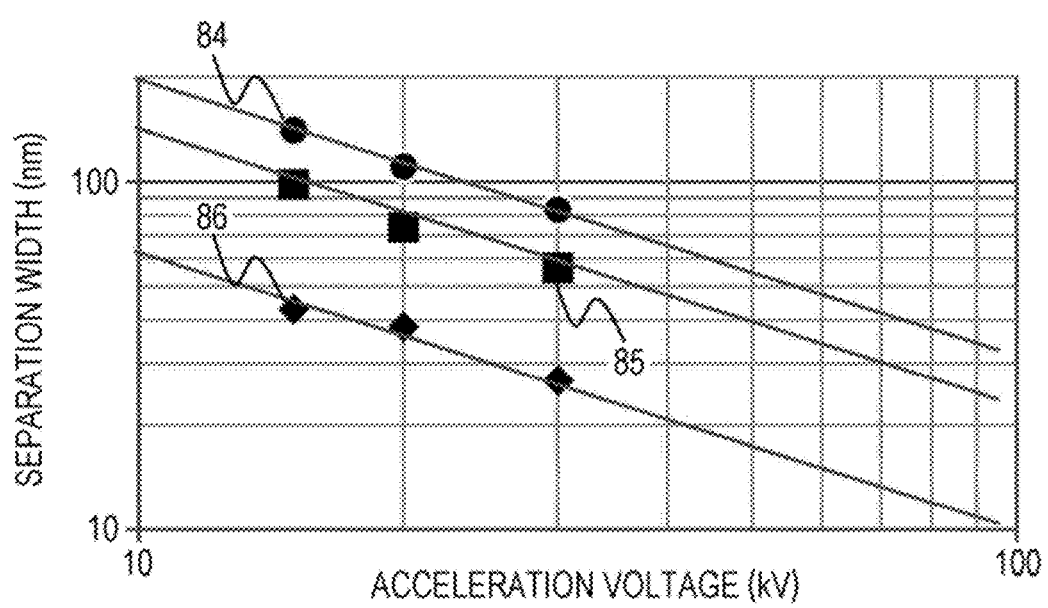
FIG. 7E is a diagram showing an example of a result of measuring a separation width of an edge contrast while changing an acceleration voltage of the ion beam.

FIG. 7E is a diagram showing an example of a result of measuring the separation width of the edge contrast while changing the acceleration voltage of the ion beam. It is possible to change the separation width of three types of edge contrasts shown in FIG. 7C by changing the strength of the deflection magnetic field or the acceleration of the ion beam. In this example, the acceleration voltage was measured as 30 kV/20 kV/15 kV. If the acceleration voltage is decreased, since the influence of the deflection magnetic field becomes relatively large, the separation width is increased. Even if the acceleration voltage is the same, the separation width is changed as the deflection magnetic field is changed. The largest separation width 84 corresponds to $H^+$ ions and $H_3^+$ ions, and the smallest separation width 86 corresponds to $H_2^+$ ions and $H_3^+$ ions. The intermediate separation width 85 corresponds to $H^+$ ions and $H_2^+$ ions.

When an unintended magnetic field is applied to the ion beam 15 and a plurality of ion species are mixed in the ion beam 15, there is a possibility that the above-mentioned separation action may hinder the observation of the surface of the sample. The vacuum chamber 17 is preferably made of a material having a high magnetic permeability (for example, permalloy or pure iron) to prevent the influence of the unintended magnetic field on the ion beam 15. Alternatively, a component made of a material having a high magnetic permeability which has a magnetic field leakage prevention function may be provided in the vicinity of (that is, inside the vacuum chamber 17) an optical path through which the ion beam 15 passes. Alternatively, a device cover having a magnetic field leakage prevention function may be provided outside the vacuum chamber 17. These may be appropriately combined as needed.

The mass filter 78 may be attached as needed. The mass filter 78 can be configured to transmit specific ions. The mass filter 78 can be used to measure how many ions other than $H_3^+$ ions are emitted from the ion source. For example, the mass filter 78 can be used to measure whether the setting value of the extraction voltage is suitable for increasing the emission ratio of $H_3^+$ ions.

The mass filter 78 can include a component which generates the deflection magnetic field. Although there may be the case in which the trajectories of ion beams of the same accelerated $H^+$ ions, $H_2^+$ ions, and $H_3^+$ ions emitted from the same spot are the same depending on the deflection electric field, it is possible to separate the trajectories of the ion beams depending on the deflection magnetic field. The separation width can also be used at the time of measuring the emission ratio of ion species.

If the mass filter 78 is designed to minimize the aberration, it is possible to perform irradiation with a beam having the high emission ratio of $H_3^+$ ions and maintaining the focusing performance by filtering unnecessary ion species as well as measuring the emission ratio of $H_3^+$ ions. In addition, it is possible to minimize the occurrence of aberration only by separating other hydrogen ions ($H^+$ ion and $H_2^+$ ion) from $H_3^+$ ions. Alternatively, it is possible to make the filter with lower cost. Generally, the smaller the mass-to-charge ratio, the larger the deflection amount of the ion beam by the magnetic field. In addition, the larger the mass-to-charge ratio, the easier the separation of different ion species.

It is not always necessary to generate the deflection magnetic field for separating the ion beam using the mass filter 78. For example, the deflection magnetic field can be applied in the first deflector 73, the second deflector 74, and a space between the objective lens 76 and the sample 31 in the sample chamber 3. When the ion beam acceleration voltage is large (for example, 10 kV or more), since the electric field is frequently used practically for the deflection of the ion beam, the first deflector 73 and the second deflector 74 may be configured to generate the deflection magnetic field by an electric field as in the related art, and a third deflector generating the deflection magnetic field for the separation of the ion beams may be provided newly. Alternatively, the first deflector 73 or the second deflector 74 may be configured so that the magnetic field can be superimposed on the electric field.

It is considered that the conventional ion beam apparatus is used at (1) the extraction voltage at which a normal current reaches a peak value (first maximum), or (2) a voltage lower than the peak value expected to narrow the energy width. In other words, the second peak has an energy width much narrower than that of the first peak. To discover this, a detailed experiment is required. In addition, although there is a need to apply a magnetic field to identify ions having different mass-to-charge ratios, in an ion microscope, it is not normally assumed to use a deflector that generates a magnetic field, and all electric field deflections and an electric field lens are used. The inventors have tried experiments of applying a magnetic field to identify ion species, thereby identifying ion species as shown in FIGS. 7A to 7E.

The control device 791 may be configured to have a function of estimating the ratio of ion species from a scanned ion image in which ion species are mixed as shown in FIGS. 7A to 7D. The control device 791 analyzes the scanned ion image acquired by applying the deflection magnetic field to the ion beam 15 while changing the extraction voltage to be able to clarify the dependence of the ratio of ion species mixed in the ion beam on the extraction voltage. The control device 791 may control the high voltage power supply 111 based on the result.

The ion beam apparatus 1000 may include a display device 792. The display device 792 may display ion species which are currently emitted at the highest ratio. In addition, the display device 792 may be configured to display ions made of the same elements and having different mass-to-charge ratios and allow a user to select any of ions using the control device 791. For example, the display device 792 may display at what ratio $H^+$ ions, $H_2^+$ ions, and $H_3^+$ ions are being emitted. In addition, the display device 792 may display which of the hydrogen ions is being emitted at a highest ratio.

Ions with which the sample is irradiated may be switched by adjusting the extraction voltage applied to the mass filter 78 and the emitter electrode 11. The display device 792 may be configured to allow a user to select which of the hydrogen ions is emitted at a highest ratio. Even if $H^+$ ions, $H_2^+$ ions, and $H_3^+$ ions have the same acceleration energy, since penetration depths of the $H^+$ ions, $H_2^+$ ions, and $H_3^+$ ions into the sample are different, it is possible to change a penetration range for the sample by switching the ions. This can be used for manufacturing processes, characteristic adjustment, or the like of electronic devices. Instead of adjusting the extraction voltage, ions may be switched by, for example, the voltage of the lens, the angle of the tip, and the like. In particular, since a penetration range of molecular ions is decreased as the number of atoms in a molecule is increased, it is suitable for suppressing damage to the inside of the sample due to spreading of ions in the sample. For example, the $H_3^+$ ion beam having an acceleration voltage of 30 kV has the same penetration range as the $H^+$ ion beam having an acceleration voltage of 10 kV.

Figure 8:
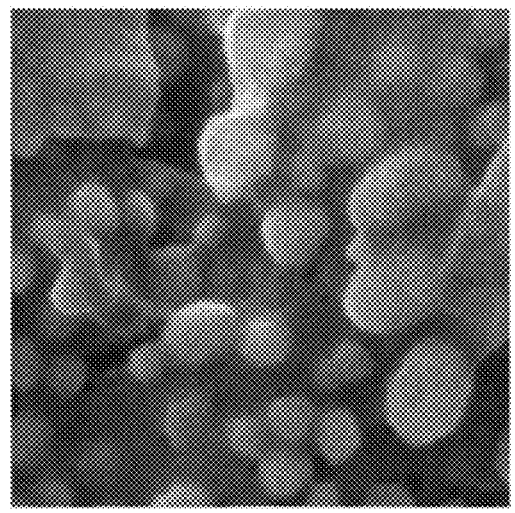
FIG. 8 shows an example of observing a surface of a sample in which gold microparticles are deposited on a carbon parent body in a state in which a ratio of $H_3^+$ ions to an ion beam is estimated to be 80% or more.

FIG. 8 shows an example of observing a surface of a sample in which gold microparticles are deposited on a carbon parent body in a state in which a ratio of $H_3^+$ ions to an ion beam is estimated to be 80% or more. As shown in FIG. 7B or 7C, it can be seen that the surface of the sample can be observed well even without separating the edge contrast. In the sample observation, a diameter of the ion beam with which the sample is irradiated may be set to be 10 nm or less on the sample face.

The beam irradiation column 7 is evacuated using the vacuum pump 77. The sample chamber 3 is evacuated using the vacuum pump 34. If necessary, the evacuation between the gas field ionization source 1 and the beam irradiation column 7 and between the beam irradiation column 7 and the sample chamber 3 may be differently made. In other words, the space between the gas field ionization source 1 and the beam irradiation column 7 and the space between the beam irradiation column 7 and the sample chamber 3 except for the opening through which the ion beam 15 passes may be kept airtight. By this configuration, the amount of gas introduced into the sample chamber 3 which flows into the gas field ionization source 1 is decreased and thus the influence is decreased. In addition, the amount of gas introduced into the gas field ionization source 1 which flows into the sample chamber 3 is decreased and thus the influence is decreased.

The ion beam apparatus 1000 may be provided on, for example, an apparatus frame 60 including a vibration proof mechanism 61 and a base plate 62 to prevent the performance of the observation or processing of the sample from deteriorating due to the vibrations of the emitter electrode 11 of the gas field ionization source 1, the sample 31 installed inside the sample chamber 3, or the like. The vibration proof mechanism 61 can be configured using, for example, an air spring, a metal spring, a gel-like material, rubber, or the like. Although not shown, an apparatus cover may be installed to cover the whole or a part of the ion beam apparatus 1000. The apparatus cover is preferably made of a material capable of blocking or damping air vibrations from the outside.

In order to introduce reactive gas or gas for suppressing the surface of the sample 31 from being charged in the vicinity of the sample 31, the sample chamber 3 may include a gas supplier 38. The gas supplier 38 includes a gas nozzle 381, a flow rate adjustor 384, and a gas cylinder 386. As the reactive gas, (a) for example, $XeF_2$ gas, $H_2O$ gas, or a halogen-based gas as gases for promoting etching of the sample 31, and (b) TEOS, hydrocarbon gas, or gas such as $WF_6$ containing metal as gas for promoting deposition may be used. Since the processing amount of the sample with respect to the implantation amount of ion can be increased by sample processing using a gas that promotes etching, the damage to the substrate of the sample can be reduced.

By combining the sample processing using various reactive gases as described above, the ion beam apparatus 1000 can perform, for example, (a) correction of a photomask used in a semiconductor process, (b) correction of a photomask used for a semiconductor process using extreme ultraviolet (EUV) lithography, (c) correction of a mold used for nanoimprint lithography, and the like. The $H_3^+$ ion beam having a good convergence and a small energy width is suitable for the correction of the photomask or the mold having the substantially same size as the structure of the semiconductor device. Various devices can be manufactured by using the processing of the sample using the reactive gas and the reactivity of the $H_3^+$ ion beam itself.

The sample chamber 3 is evacuated by the vacuum pump 34. As the vacuum pump 34, for example, a turbo molecular pump, an ion sputtering pump, a non-evaporation getter pump, a sublimation pump, a cryopump, and the like are used. A plurality of combinations of the pumps as described above may also be used. The apparatus may be configured to operate the vacuum pump 34 in cooperation with the gas supplier 38 only when gas is introduced from the gas nozzle 381 or a valve may be installed between the vacuum pump 34 and the sample chamber 3 to adjust the displacement.

Although not shown, the sample chamber 3 can include a sample exchange chamber. The sample exchange chamber may be configured to perform preliminary evacuation for exchanging the sample 31. By doing so, it is possible to suppress the degree of vacuum of the sample chamber 3 from decreasing at the time of exchanging the sample.

Figure 9A:
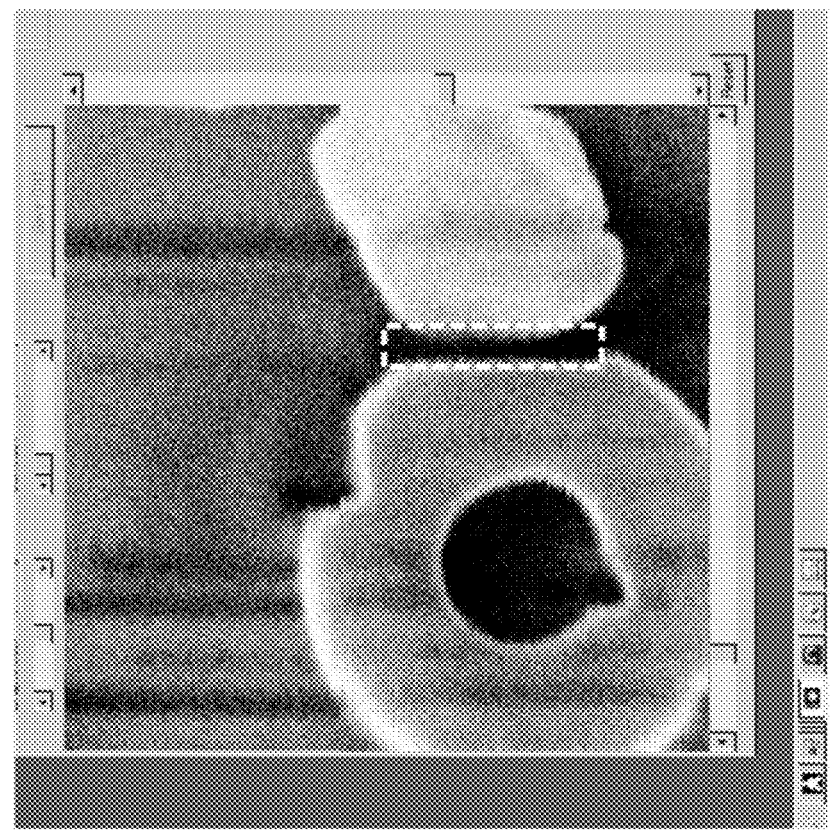
FIG. 9A shows an example of observing the surface of the sample under conditions in which hydrogen gas and neon gas are mixed and introduced into the gas field ionization source and a large amount of $H_3^+$ ion beam is included.

FIG. 9A shows an example of observing the surface of the sample under conditions in which hydrogen gas and neon gas are mixed and introduced into the gas field ionization source 1 and a large amount of $H_3^+$ ion beam is included. Typically seen when a considerable amount of gas impurities exist, the rapid change in the image contrast due to the increase or decrease in current was not observed. That is, it was found that the emission of $H_3^+$ is very stable regardless of the gas mixing. It was found that the gas species mixed with the hydrogen gas is not limited to neon, but other gas species are similarly stable. In other words, a combination of $H_3^+$ and other heavy ions is suitable for rapid ion beam switching by changing the extraction voltage.

Figure 9B:
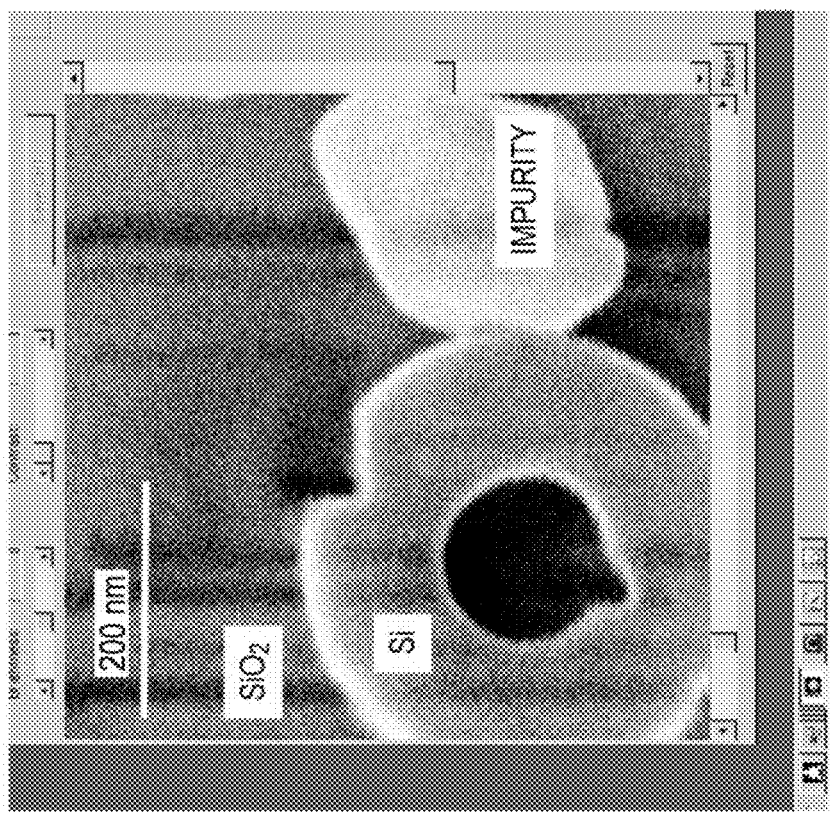
FIG. 9B shows an example of processing the surface of the sample by switching the ion beam to the neon ion beam and then observing the surface of the sample using the $H_3^+$ ion beam.

FIG. 9B shows an example of processing the surface of the sample by switching the ion beam to the neon ion beam and then observing the surface of the sample using the $H_3^+$ ion beam. The dotted line portion is the processed spot. As shown in FIG. 9B, it is possible to achieve stability of the ion beam at the time of the observation in addition to quickly switching between the processing and the observation.

Figure 10:
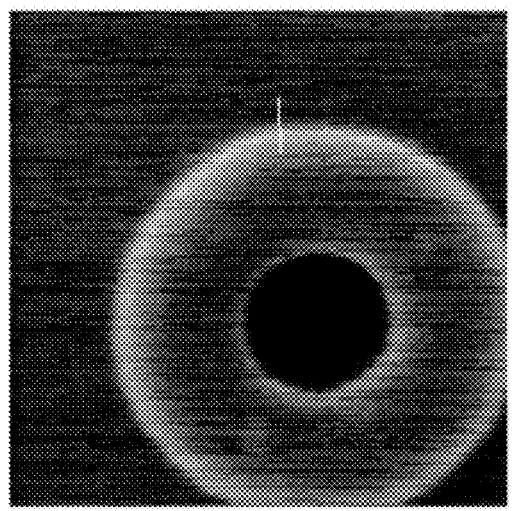
FIG. 10 shows an example of observing the surface of the sample by mixing hydrogen gas and neon gas and introducing the mixed hydrogen gas and neon gas into the gas field ionization source and extracting the neon ion beam.

FIG. 10 shows an example of observing the surface of the sample by mixing hydrogen gas and neon gas and introducing the mixed hydrogen gas and neon gas into the gas field ionization source 1 and extracting the neon ion beam. As shown in FIG. 10, the gas field ionization source generally has weak resistance to impurity gases. Therefore, if gases are mixed, instability such as the increase and decrease in a current amount occurs. However, when the ion beam is used for processing purpose, since the processing amount can be controlled by the total current amount, the influence due to the increase or decrease in the amount of current is insignificant as compared to the observation.

Second Embodiment: Summary

The ion beam apparatus 1000 according to the second embodiment uses the gas field ionization source 1 described in the first embodiment, such that it is possible to suppress the damage to the sample at the time of the sample observation, make the observation resolution or the processable width excellent, and switch the beam type at a high speed.

Regarding Modifications of the Present Invention

The present invention is not limited to the above-mentioned embodiments, but includes various modifications. For example, the above-described embodiments have been described in detail in order to facilitate the explanation of the present invention, and are not necessarily to be construed as including all of the components described above.

In the above embodiments, the apparatus for evacuating the vacuum chamber 17 and the apparatus for evacuating the gas mixer 352 are common, but the evacuation may be made by different vacuum evacuation apparatuses.

In the above embodiments, the inside of the vacuum chamber 17 is kept at an ultrahigh vacuum of $10^{-7}$ Pa or less when no gas is introduced from the gas supplier 37. In order to set the inside of the vacuum chamber 17 to be the ultrahigh vacuum, a process (so-called baking) of heating the entire vacuum chamber 17 to 100° or more may be included in a start-up operation of the gas field ionization source 1.

In the above embodiments, a method including a process of heating the emitter tip 11 may be used in order to terminate the point of the emitter tip 11 with three or less atoms, preferably one atom. Similarly, to sharpen the point of the emitter tip 11, a method of introducing gases such as $O_2$ and $N_2$ into the vacuum chamber 17 while heating the emitter tip 11 may be used. Similarly, to sharpen the point of the emitter tip 11, a method of introducing gases such as $O_2$ and $N_2$ into the vacuum chamber 17 while applying a high voltage between the emitter tip 11 and the extraction electrode 13 may be used as well. Similarly, a method of configuring the emitter tip 11 by a needle made of tungsten as a main component, depositing noble metal (for example, iridium, palladium, platinum, or the like) on the surface of the emitter tip, and then heating the emitter tip 11 may be used as well.

Although the above embodiments describe that the ion beam apparatus 1000 emits an ion beam, the ion beam apparatus can include a function portion of emitting an electron beam.

In the above embodiments, if the ratio of $H_3^+$ ions to the ion beam 15 is 80% or more by adjusting the extraction voltage applied to the mass filter 78 or the emitter electrode 11, or the like, it is suitable for the sample observation.

In the above embodiments, it is expected that even $N_2$ or $O_2$ gas which is a diatomic molecule similar to hydrogen gas $H_2$ causes the same phenomenon as $H_3^+$ ions described with reference to FIGS. 3A to 4B. Similarly to $H_3^+$, if $N_2$ or $O_2$ can be emitted as $N_3^+$ or $O_3^+$, it can be expected that the focusing performance is improved, the reactivity is improved as compared with $N_2^+$ or $O_2^+$, and the processing rate is improved by decreasing the energy width as compared with $N_2^+$ or $O_2^+$.

The above embodiments described that it is possible to shorten the time taken to evacuate the inside of the vacuum chamber 17 at the time of switching the ion beam types by using the mixing resistance of the $H_3^+$ ions. However, the use of the evacuation device 16 is not excluded, and the ion beam type may be switched after the inside of the vacuum chamber 17 is evacuated as before.

What is claimed is:

1. An ion beam apparatus, comprising:
   an emitter tip having a needle-like point;
   an extraction electrode having an opening which is disposed to be opposite to the emitter tip and is at a position separated from the emitter tip;
   a gas supply source supplying gas;
   a gas supply pipe supplying the gas supplied from the gas supply source to the vicinity of the emitter tip;
   a voltage applying portion performing irradiation with an ion beam from the emitter tip by applying a voltage between the emitter tip and the extraction electrode,
   wherein the voltage applying portion is configured for switching ion beam types by switching between an operation mode of applying a first voltage with which irradiation with the ion beam including mostly $H_3^+$ ions is performed and an operation mode of applying a second different voltage with which irradiation with the ion beam including mostly an ion heavier than $H_3^+$ is performed without performing an evacuation between the operation mode of applying the first voltage and the operation mode of applying the second voltage, and a stability of an $H_3^+$ ion current is kept constant; and
   wherein the gas supply source supplies, while supplying a first type of gas, a second type of gas different from the first type of gas;
   wherein the gas supply source includes a first gas cylinder supplying the first type of gas and a second gas cylinder supplying the second type of gas;
   a gas mixer storing the first type of gas, received from the first gas cylinder after passing through a first gas filter followed by a first flow rate adjustor, and the second type of gas, received from the second gas cylinder after passing through a second flow rate adjustor followed by a second gas filter, and disposed between the gas supply source and the gas supply pipe; and a mixing ratio controller controlling a gas mixing ratio in the gas mixer by adjusting a flow rate of the first type of gas and a flow rate of the second type of gas by controlling the first and second flow rate adjustors.

2. The ion beam apparatus according to claim 1, wherein the point of the emitter tip is terminated with three or less atoms.

3. The ion beam apparatus according to claim 1, wherein the gas supply source supplies hydrogen gas and argon gas, and the voltage applying portion switches between an operation mode of applying a voltage with which irradiation with the ion beam mostly including the $H_3^+$ ion is performed and an operation mode of applying a voltage with which irradiation with the ion beam mostly including argon is performed.

4. The ion beam apparatus according to claim 1, further comprising:
a user interface designating an ion current value of the ion beam,
wherein the mixing ratio controller controls the gas mixing ratio such that the ion beam has the ion current value designated by the user interface.

5. The ion beam apparatus according to claim 1, further comprising:
a user interface designating the operation mode to switch between the ion beam mostly including $H_3^+$ ion and the ion beam mostly including ion other than the $H_3^+$ ion,
wherein the voltage applying portion applies a voltage with which irradiation with the ion beam designated via the user interface is performed.

6. The ion beam apparatus according to claim 5, wherein the user interface receives the designation to switch between an operation mode of observing a sample and an operation mode of processing the sample, the voltage applying portion applies a voltage with which irradiation with the ion beam mostly including the $H_3^+$ ion is performed when the operation mode of observing the sample is designated via the user interface and a voltage with which irradiation with the ion beam most mostly including the ion heavier than $H_3^+$ is performed when the operation mode of processing the sample is designated via the user interface.

7. The ion beam apparatus according to claim 1, wherein a difference between the first voltage and the second voltage ranges from 10% to 50% of the first voltage or from 10% to 50% of the second voltage.

8. The ion beam apparatus according to claim 1, wherein an ion current of the ion beam most mostly including the ion heavier than the $H_3^+$ is 3.0 times or more an ion current of the ion beam most mostly including the $H_3^+$ ion.

9. The ion beam apparatus according to claim 1, further comprising:
a second gas supply source supplying a different type of gas from the gas supplied from the gas supply source; and
a second gas supply pipe supplying the gas supplied from the second gas supply source to the vicinity of the emitter tip,
wherein the voltage applying portion switches between the first voltage and the second voltage when the gas supply pipe and the second gas supply pipe each supply the gas to the vicinity of the emitter tip to switch the ion beam types.

10. The ion beam apparatus according to claim 1, further comprising:
a column housing a space in the vicinity of the emitter tip; and
an evacuation device evacuating an inside of the column,
wherein the voltage applying portion switches between the first voltage and the second voltage after the evacuation device evacuates the inside of the column to switch the ion beam types.

11. The ion beam apparatus according to claim 1, further comprising:
a lens focusing the ion beam;
a deflector deflecting the ion beam;
an aperture having an opening through which the ion beam passes; and
a controller controlling the lens, the deflector, and the aperture,
wherein the controller switches a state of each of the lens, the deflector, and the aperture, when the voltage applying portion switches between the first voltage and the second voltage.

12. The ion beam apparatus according to claim 1, further comprising:
an image processing device acquiring an observation image of a sample obtained by irradiating the sample with the ion beam,
wherein the image processing device switches between an image shift amount and an astigmatism correction amount which are applied to the observation image as the voltage applying portion switches between the first voltage and the second voltage.

* * * * *